US 6,681,365 B1

(12) United States Patent
Anand et al.

(10) Patent No.: US 6,681,365 B1
(45) Date of Patent: Jan. 20, 2004

(54) METHOD AND APPARATUS FOR PROVIDING CHANNEL ERROR PROTECTION FOR A SOURCE CODED BIT STREAM

(75) Inventors: Raghavan Anand, Berkeley, CA (US); Hui-Ling Lou, Murray Hill, NJ (US); Christine Irene Podilchuk, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 386 days.

(21) Appl. No.: 09/680,708

(22) Filed: Oct. 6, 2000

Related U.S. Application Data

(60) Provisional application No. 60/165,803, filed on Nov. 16, 1999.

(51) Int. Cl.[7] .............................................. H03M 13/03
(52) U.S. Cl. ....................................................... 714/790
(58) Field of Search .................................. 714/786, 790

(56) References Cited

U.S. PATENT DOCUMENTS 6,397,367 B1 * 5/2002 Park et al. ................... 714/786
6,487,693 B1 * 11/2002 Kim et al. ................... 714/786

OTHER PUBLICATIONS

Xiong et al., Progressive video coding for noisy channels, 1998, IEEE, p. 334–337.*
Lu et al., Progressive source–channel coding of images over bursty error channels, 1998, IEEE, p. 127–131.*
Sherwood et al., Error protection for progressive image transmission over memoryless and fading channels, 1998, IEEE, p. 324–328.*
Sherwood et al., Progressive image coding on noisy channels, 1997, IEEE, p. 72–81.*

J. Hagenauer et al., "Channel Coding and Transmission Aspects for Wireless Multimedia," Proc. of the IEEE, vol. 87, No. 10, pp. 1764–1777, Oct. 1999.
H. Shi et al., "Combined Speech and Channel Coding for Mobile Radio Communications," IEEE Transactions on Vehicular Technology, vol. 43, No. 4, pp. 1078–1087, Nov. 1994.
A. Said et al., "A New, Fast and Efficient Image Codec Based on Set Partitioning in Hierarchical Trees," IEEE Transactions on Circuits and Systems for Video Technology, vol. 6, No. 3, pp. 243–250, Jun. 1996.
B–J. Kim et al., "Very Low Bit–Rate Embedded Video Coding with 3D Set Partitioning in Hierarchical Trees (3D SPIHT)," IEEE Transactions on Circuits and Systems for Video Technology, Special Issue on Image and Video Processing for Emerging Interactive Multimedia Services, pp. 1–30, Oct. 1999.

(List continued on next page.)

*Primary Examiner*—Albert Decady
*Assistant Examiner*—Shelly A Chase

(57) ABSTRACT

Unequal channel error protection is provided for a bit stream, e.g., a progressive source coded bit stream, by puncturing of a channel code. The channel code has a specified rate associated with a corresponding level of error protection, and is used to code a first portion of the bit stream. The channel code is subsequently punctured for at least a second portion of the bit stream so as to provide a rate higher than that of the designated rate. Commencement of the puncturing is deliberately delayed by an amount determined based at least in part on a memory of the channel code. Advantageously, the delay prevents propagation of errors in a channel decoder used to decode the channel coded bit stream. The progressive bit stream may be a progressive source coded video or audio bit stream, any other type of progressive information bit stream, or a partitioned source coded bit stream.

25 Claims, 3 Drawing Sheets

OTHER PUBLICATIONS

B-J. Kim et al., "Low-Delay Embedded 3-D Wavelet Color Video Coding with SPIHT," Proc. SPIE, vol. 3309, pp. 955-964, 1997.

J. Hagenauer, "Rate-Compatible Punctured Convolutional Codes (RCPC Codes) and Their Applications," IEEE Transactions on Communications, vol. 36, No. 4, pp. 389-400, Apr. 1988.

J. Hagenauer et al., "The Performance of Rate-Compatible Punctured Convolutional Codes for Digital Mobile Radio," IEEE TRansactions on Communications, vol. 38, No. 7, pp. 966-980, Jul. 1990.

H. Lou, "Viterbi Decoder Design for the IS-95 CDMA Forward Link," Proceedings of the IEEE Vehicular Technology Conference, Atlanta, GA, pp. 1346-1350, Apr. 1996.

* cited by examiner

FIG. 3

| $b_1$ | $b_2$ | $b_3$ | $b_4$ | ... | $b_N$ |

FIG. 4A

CLASS 1  CLASS 2  CLASS 3  CLASS 4  ...  CLASS $N$

| $\frac{n}{k}b_1$ | $\frac{n}{k}b_2$ | $\frac{n}{k}b_3$ | $\frac{n}{k}b_4$ | ... | $\frac{N}{k}b_N$ |

CLASS 1  CLASS 2  CLASS 3  CLASS 4  ...  CLASS $N$

| $\frac{n}{k}b_1$ | $\frac{n}{k}b_2$ | $\frac{n}{k}b_3$ | $\frac{n}{k}b_4$ | ... | $\frac{N}{k}b_N$ |

$\frac{n}{k}b_1 + L$
$P_1$ $\frac{n}{k}b_2$
$P_2$ $\frac{n}{k}b_3$
$P_3$ $\frac{n}{k}b_4$
$P_4$

...

$\frac{N}{k}b_N - L$
$P_N$

METHOD AND APPARATUS FOR PROVIDING CHANNEL ERROR PROTECTION FOR A SOURCE CODED BIT STREAM

PRIORITY CLAIM

The present application claims the benefit of U.S. Provisional Application No. 60/165,803, filed Nov. 16, 1999 and entitled "Method for Progressive Forward Error Protection Using Convolutional Codes."

RELATED APPLICATION

The present application is related to U.S. patent application Ser. No. 09/680,709 entitled "Method And Apparatus For Video Transmission Over a Heterogeneous Network Using Progressive Video Coding," filed concurrently herewith in the name of inventors R. Anand, H.-L. Lou and C. Podilchuk, and incorporated by reference herein.

FIELD OF THE INVENTION

The present invention relates generally to information coding, and more particularly to techniques for providing error protection for progressive bit streams using convolutional codes and other types of channel codes.

BACKGROUND OF THE INVENTION

In a progressive source coded bit stream, bits are generally arranged in order of decreasing importance, such that the quality of the source signal that can be reconstructed at the receiver depends upon the number of bits received. Conventional progressive source coding techniques of this type are described in, e.g., A. Said et al., "A New and Efficient Image Codec Based on Set Partitioning in Hierarchical Trees," IEEE Transactions on Circuits and Systems for Video Tech., June 1996; B.-J. Kim et al., "Very Low Bit-Rate Embedded Coding with 3D Set Partitioning in Hierarchical Trees," IEEE Transactions on Circuits and Systems for Video Technology, Special Issue on Image and Video Processing for Emerging Interactive Multimedia Services, September 1998; and B.-J. Kim et al., "Low-Delay Embedded Video Coding with SPIHT," Proc. SPIE, Visual Communications and Image Processing '98, pp. 955–964, January 1998.

Consider as an example an N-bit progressive source coded bit stream arranged in the order $\{a_0, a_1, a_2, \ldots a_N\}$, where $a_0$ represents the most important bit and $a_N$ represents the least important bit. If only a given subset $\{a_0, \ldots a_i\}$ ($1 \leq i < N$) of the ordered bits is received at the receiver, then a coarse representation of the source signal can be reconstructed based on these (i+1) bits. The reconstructed signal quality thus increases with the number of bits received successfully. However, if $a_i$ is not received successfully and $a_j$ with j>i is received successfully, the $a_j$ bit generally cannot be used by the source decoder to improve the decoded signal quality. Therefore, a channel code used in conjunction with transmission of the source coded bit stream through a communication channel should preferably be designed to ensure that the most important bits, i.e., the bits with smaller values of i, are provided with the highest level of error protection and that the error protection decreases for bits with increasing values of i.

A number of techniques for providing unequal error protection (UEP) via channel codes are described in U.S. patent application Ser. No. 09/022,114, filed Feb. 11, 1998 in the name of inventors D. Sinha and C.-E. W. Sundberg and entitled "Unequal Error Protection for Perceptual Audio Coders," which is incorporated by reference herein. In one such technique, a source coded bit stream is divided into different classes of bits, with different levels of error protection being provided for the different classes of bits. For example, a source coded bit stream may be divided into class I and class II bits, with class I bits protected by a lower rate channel code than that used to protect the class II bits.

In order to reduce hardware complexity, these and other techniques may make use of rate compatible punctured convolutional (RCPC) codes to implement the different channel code rates required for UEP. RCPC codes are described in J. Hagenauer, "Rate-Compatible Punctured Convolutional Codes (RCPC Codes) and Their Applications," IEEE Transactions on Communications, Vol. 36, April 1988; and J. Hagenauer et al., "The Performance of Rate-Compatible Punctured Convolutional Codes for Digital Mobile Radio," IEEE Transactions on Communications, Vol.28, July 1990. With reference to the previous example, RCPC codes can be used to implement the channel codes of the both the class I rate and the class II rate.

In certain of the UEP techniques described in the above-cited U.S. patent application Ser. No.09/022,114, the source coded bits of the different classes are generally coded separately and each class is further separated into blocks in order to avoid error propagation that can significantly degrade the channel decoder performance. This separation into blocks requires that so-called tail bits be used to terminate each block of a given one of the codes. As noted above, in the case of a progressive source coded bit stream, if a given bit $a_i$ is not received successfully, a subsequent bit $a_j$(j>i) generally cannot be used to improve the decoded signal quality. Channel error protection should therefore also be provided progressively, with decreasing error protection to the bits $a_i$, $a_{i+1}$, $a_{i+2}$ and so on in the source coded bit stream. However, application of the above-described multi-class UEP technique to a progressive source coded bit stream may result in the source coded bit stream being divided into many sub-blocks with each sub-block subject to an increasing code rate. Such an arrangement may necessitate an unduly large number of tail bits, thereby substantially increasing the overhead associated with implementation of the technique.

As is apparent from the foregoing, a need exists for improved techniques for providing channel error protection for source coded bit streams.

SUMMARY OF THE INVENTION

The present invention meets the above-described need by providing a method and apparatus for implementing channel error protection for a progressive source coded bit stream or other type of source coded bit stream.

In accordance with the invention, unequal channel error protection is provided for a source coded bit stream by puncturing of a channel code. The source coded bit stream is preferably a progressive source coded bit stream, but could be another type of source coded bit stream, e.g., a partitioned bit stream. The channel code has a specified rate associated with a corresponding level of error protection, and is used to code a first portion of the source coded bit stream. The channel code is subsequently punctured for at least a second portion of the source coded bit stream so as to provide a rate higher than that of the designated rate. Commencement of the puncturing step is deliberately delayed by an amount determined based at least in part on a memory of the channel code. For example, the amount of delay may be specified as a number of bits which is greater than or equal to a memory of the channel code, but less than or equal to a decoding depth of a channel decoder used to decode the channel coded bit stream.

Advantageously, the invention avoids the excessive overhead problems attributable to the tail bits required for termination of sub-blocks in conventional unequal error protection (UEP) techniques. Although particularly well-suited for use with progressive source coded video bit streams, the invention is more generally applicable to any type of progressive information bit stream requiring channel error protection, as well as to other types of bit streams including partitioned source coded bit streams.

BRIEF DESCRIPTION OF THE DRAWINGS

FIG. 3 shows an example of a progressive source coded bit stream with multiple levels of channel error protection in accordance with the invention.

FIGS. 4A and 4B illustrate the manner in which the FIG. 3 bit stream is punctured using the techniques of the invention.

DETAILED DESCRIPTION OF THE INVENTION

The following description will illustrate the invention using exemplary communication systems which utilize progressive source coded bit streams. It should be understood, however, that the invention is not limited to use with any particular type of communication system or application, but is instead more generally applicable to any communication system or application in which it is desirable to provide channel error protection for a source coded bit stream in an efficient manner which minimizes the need for terminating tail bits. The invention is particularly well-suited for use with progressive source coded video bit streams. However, the unequal error protection techniques described herein are also applicable to other types of progressive bit streams, including audio and other information bit streams. In addition, the techniques of the invention can be applied to partitioned versions of source coded bit streams generated using conventional non-progressive coding techniques such as H.261, H.263, Motion-JPEG, MPEG-1, MPEG-2, etc.

Figure 1:
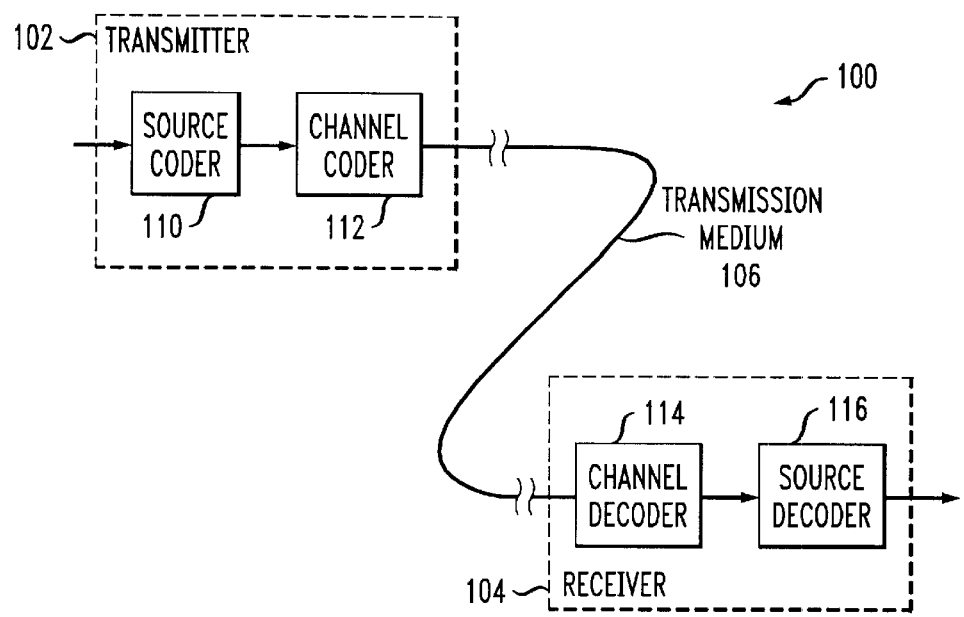
FIG. 1 shows a simplified block diagram of one type of communication system in which the present invention may be implemented.

FIG. 1 shows a simplified block diagram of an example communication system 100 in which the present invention may be implemented. The system 100 includes a transmitter 102 and a receiver 104 configured to communicate over a transmission medium 106. The transmission medium 106 may represent a portion of a wired or wireless network, combinations of different portions of such networks, or any other type of communication channel. The transmitter 102 includes a source coder 110 and a channel coder 112. The receiver 104 includes a channel decoder 114 and a source decoder 116.

In operation, a stream of information bits is applied to the source coder 110. The source coder 110 generates a progressive source coded bit stream using conventional techniques. The progressive source coded bit stream is then applied to the channel coder 112, which applies unequal error protection channel coding to the progressive source coded bit stream using the techniques of the present invention. The channel coding techniques utilized in channel coder 112 will be described in greater detail below in conjunction with FIG. 2. The output of the channel coder 112 may be further processed using conventional communication system operations such as modulation, multiplexing, upconversion, amplification, filtering, etc. These operations are omitted from the figure for simplicity and clarity of illustration. The resulting signal is passed over the transmission medium 106 and subject to complementary communication system operations in or prior to the receiver 104. The recovered channel coded bit stream is applied to channel decoder 114, and the resulting progressive source coded bit stream is decoded in source decoder 116 to obtain a reconstructed version of the original information bit stream.

The source coder 110 and source decoder 116 may be a progressive video coder and video decoder, respectively, as will be described in greater detail in conjunction with FIG. 3. The channel coder 112 and channel decoder 114 are preferably a convolutional coder and decoder, respectively. However, it will be appreciated that the invention is more generally applicable to other types of source and channel coding.

The elements of the FIG. 1 system are shown in simplified form for clarity of illustration. It should be understood that one or more of these elements may be implemented using processor-based devices such as microprocessors, digital signal processors (DSPs), application-specific integrated circuits (ASICs) as well as portions or combinations of these and other devices. The invention may be implemented in whole or in part in the form of one or more software programs stored and executed by such devices. Moreover, as previously noted, the FIG. 1 system may include additional elements not explicitly shown in the figure.

Figure 2:
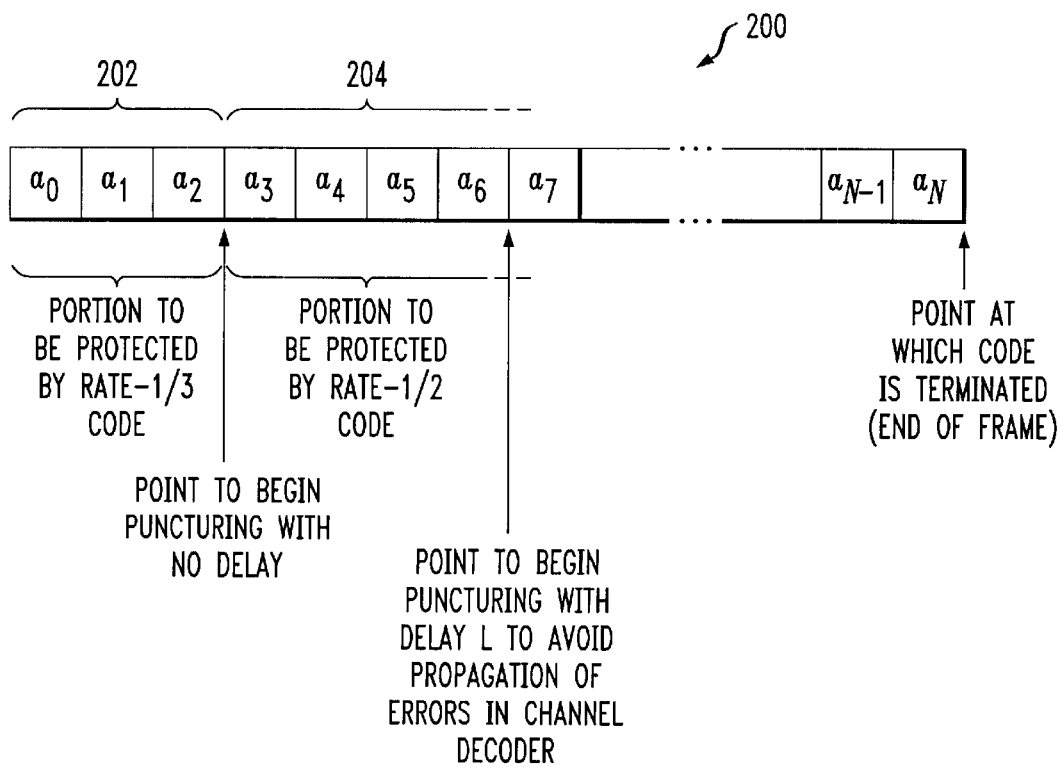
FIG. 2 illustrates a delayed puncturing of a progressive source coded bit stream in accordance with the present invention.

FIG. 2 illustrates the manner in which the channel coder 112 of FIG. 1 operates to provide unequal error protection utilizing the techniques of the present invention. In this example, an N-bit progressive source coded bit stream 200 is arranged in the order $\{a_0, a_1, a_2, \ldots a_N\}$, where $a_0$ represents the most important bit and $a_N$ represents the least important bit. It is assumed for this example that the N+1 bits $\{a_0, a_1, a_2, \ldots a_N\}$ represent a single complete frame of the progressive source coded bit stream 200. As noted previously, if only a given subset $\{a_0, \ldots a_i\}$ ($1 \leq i < N$) of the ordered bits is received at the receiver, then a coarse representation of the original source signal can be reconstructed based on these (i+1) bits. The reconstructed signal quality thus increases with the number of bits received successfully. However, if $a_i$ is not received successfully and $a_j$ with j>i is received successfully, the $a_j$ bit generally cannot be used by the source decoder to improve the decoded signal quality. The channel coder 112 is therefore configured to code the progressive source coded stream 200 continuously with decreasing levels of error protection.

The decreasing levels of error protection are provided for the stream 200 in the following manner. The channel coder 112 codes the stream 200 using a low rate convolutional code, and the low rate code is subsequently punctured to produce progressively higher rate codes for the less important bits of the stream 200. In the example, a first portion 202 of the stream 200 is protected by a full, unpunctured rate-1/3 convolutional code. In order to provide the desired decreasing levels of error protection for the progressive stream 200, a second portion 204 of the stream 200 is to be coded using a punctured version of the original rate-1/3 code. The puncturing operation involves selectively eliminating channel coded bits generated using the original rate-1/3 code so as to produce a higher rate code, which in the present example is a rate-1/2 code. Such puncturing techniques are well known in the art and are therefore not described in detail herein. However, as was noted previously, commencing the puncturing operation in a conventional manner can lead to the propagation of errors in the channel decoder, thereby degrading the reliability of the channel decoder output.

The present invention overcomes this significant problem of the prior art by deliberately delaying the commencement of the puncturing operation by a designated amount L, that may be specified in terms of a particular number of coded bits, where L is a function of the memory of the code and is preferably less than or equal to the decoding depth of the channel decoder. For example, the amount of delay L may be selected as greater than or equal to the memory of the code, but less than or equal to the decoding depth of the decoder. It should be noted that in alternative embodiments, the amount of delay L may be selected as less than the memory of the code, e.g., in an application in which the resulting performance degradation is acceptable.

The memory of a convolutional code may be described as follows. In convolutional encoding, a given n-bit output code word is generated as a function of k input bits and v bits stored in a shift register. The value of v is generally referred to as the memory of the code, and may also be referred to as the constraint length of the code. The rate of the code is given by k/n, where n>k. The convolutional encoder operates as a finite state machine with a maximum of $2^v$ possible states. A given set of k input bits cause a transition from a present state, defined by v bits, to a next state, also defined by v bits, with the number n of output code bits produced being specified by the rate of the code. As noted previously, the delay L is preferably selected as greater than or equal to the memory of the code.

The need for the delay in puncturing can be further explained as follows. Assume that the progressive source coded bits $a_0$, $a_1$ and $a_2$ of portion 202 in the stream 200 are to be protected by the original rate-1/3 convolutional code and that at least bits $a_3$, $a_4$, $a_5$ and $a_6$ of portion 204 are to be protected by the above-noted rate-1/2 code generated by puncturing the rate-1/3 code. The channel coded bits corresponding to $a_m$ are denoted as $c_{3m}$, $c_{3m+1}$ and $c_{m+2}$ for values of m=0, 1, 2, and as $c_{2+2m+1}$, $c_{2+2m+2}$ for values of m=3, 4, 5 and 6. In the conventional approach, if a rate-1/3 convolutional code is used to encode all the bits $a_0$ to $a_6$, puncturing should be done on $c_{2+2m+1}$, $c_{2+2m+2}$ for m=3, 4, 5 and 6 to obtain a rate-1/2 code. However, since the bits are coded continuously without termination, puncturing $c_{2+2m+1}$, $c_{2+2m+2}$ for m=3, 4, 5 and 6 may corrupt the reliability of the decoded bits $a_0$ to $a_2$ due to the memory in the channel decoder.

In order to avoid this potential for propagation of errors in the channel decoder, the puncturing of one bit out of three coded bits in the channel coder to obtain the rate-1/2 code should commence on the coded bit $c_{3(2)+3+L}$ (=$c_{9+L}$), where as previously noted L is a function of the memory of the code and should be less than or equal to the decoding depth of the decoder. Therefore, if puncturing of coded bits is required to provide a certain rate to protect bit $a_m$ of the progressive source coded bit stream 200, the actual puncturing should commence with a delay of L coded bits.

Referring to FIG. 2, the delay L in this example is assumed to be four bits. The puncturing operation therefore commences after bit $a_6$ as shown, rather than after bit $a_2$. Advantageously, this delay in the commencement of the puncturing will prevent channel error propagation in a continuously punctured channel coded bit stream.

As a more specific example, assume the channel decoder in the FIG. 1 system is a Viterbi decoder for an IS-95 CDMA forward link, as described in H. Lou, "Viterbi Decoder Design for the IS-95 CDMA Forward Link," Proceedings of the IEEE Vehicular Technology Conference, Atlanta, Ga., April 1996, which is incorporated by reference herein. The channel coded used for the forward link in this example is a rate-1/2 256-state convolutional code. This code has a memory of 8. The Viterbi decoder described in the reference preferably uses a decoding depth of at least about 96, depending on the level of performance desired. In an embodiment of the invention utilizing this example channel code and channel decoder, one may therefore select the value of L to be less than or equal to 96, but greater than the memory 8 of the code. For example, an initial value of L of 48 or 96 may be selected. The value of L may decrease from its initial value along the length of the progressive source coded bit stream, and may be reduced to a value as low as zero at the least significant end of the progressive bit stream, as will be described in greater detail below in conjunction with FIG. 4B. This decrease in L is appropriate for a progressive bit stream in which the desired level of error protection decreases along the length of the bit stream along with the importance of the bits.

The present invention thus provides a progressive forward error correction technique to protect a source coded bit stream on a bit-by-bit level. By properly taking into account the memory of the channel code, the progressive channel code can be implemented by successively puncturing a convolutional code without having to terminate the channel code until all the source bits in the current frame are channel coded. The invention thereby prevents the propagation of errors in the channel decoder while also avoiding the overhead associated with the use of tail bits to terminate multiple sub-blocks of a given frame.

As noted above, the value of L is determined as a function of the memory of the channel code, and is preferably less than or equal to the decoding depth of the channel decoder. As previously noted, the value of L may decrease as additional puncturing is performed along a given progressive bit stream. Such an arrangement will be described in greater detail below in conjunction with FIG. 5. Simulations may be used to determine an optimum value of L or set of values of L for a given application.

Although only two levels of error protection are described in conjunction with the FIG. 2 example, it will be apparent to those skilled in the art that the invention can be used to provide a progressive unequal channel error protection for the source coded bit stream, or any desired number of particular levels of unequal channel error protection. For each variation in puncturing, the commencement of the puncturing may be delayed in the manner described previously.

Embodiments of the invention with additional levels of error protection will now be described in greater detail with reference to FIGS. 3, 4A, 4B and 5. Referring to FIG. 3, a progressive source coded bit stream is shown which includes N classes of bits $b_i$, i=1, 2, . . . N. It should be noted that the variable N in FIG. 3 is defined in a manner different than that used in conjunction with FIG. 2. More specifically, N in FIG.

3 is used to denote the number of different classes of bits, rather than to denote the number of bits as in FIG. 2.

FIG. 4A shows the manner in which puncturing could be applied to the different classes of bits in the FIG. 3 bit stream without introduction of the above-described delay L. This puncturing uses a different puncturing $P_i$ for each of the N classes of bits. As shown in FIG. 4A, the puncturing for a given class is not delayed, and therefore the above-described problem of propagation of errors in the channel decoder arises. FIG. 4B illustrates the manner in which this problem is eliminated through the introduction of the puncturing delay L. More particularly, the start of the puncturing $P_2$ for the second class of bits is delayed by L bits as shown. The subsequent classes other than the final class N are then punctured using a number of bits for each class which corresponds to that shown in FIG. 4A. As a result of the delay L, the number of bits remaining in the final class N is reduced by L.

Figure 5:
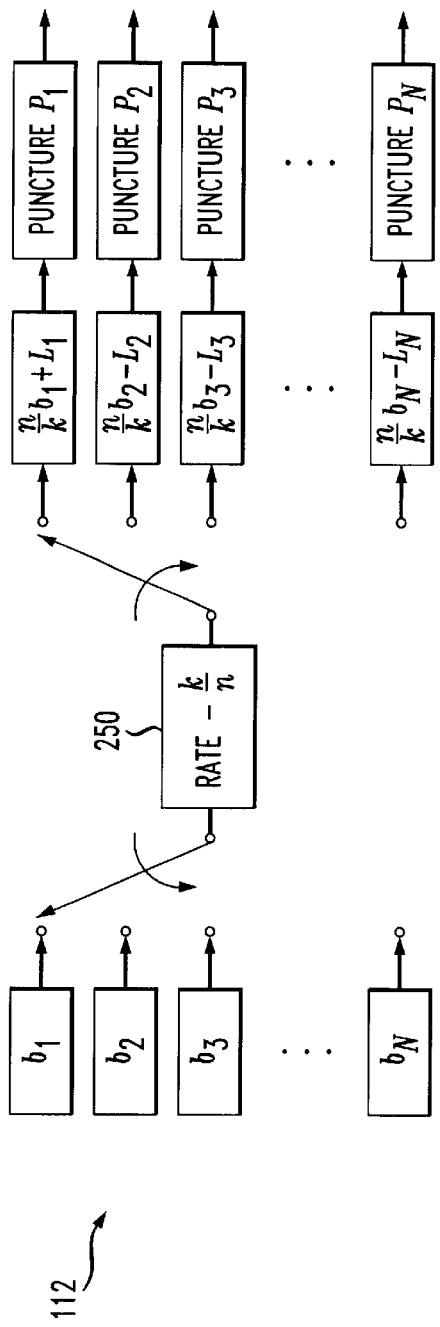
FIG. 5 shows an illustrative embodiment of a channel coder in accordance with the invention.

FIG. 5 shows an illustrative embodiment of the channel coder 112 of FIG. 1. In this embodiment, the N classes of bits $b_i$ of the FIG. 3 bit stream are applied as inputs to a rate-k/n convolutional coder 250. The resulting N classes of output bits are subject to different delays $L_i$ and puncturing $P_i$ as shown in the figure. The total number of information bits being encoded is given by $$\sum_{i=1}^{N} b_i.$$

The total number of transmitted bits in this example is given by:

$$\frac{n}{k}\sum_{i=1}^{N} b_i - \sum_{i=1}^{N} P_i,$$

where $P_i \leq P_j$ for i<j and for all i,j. The delay values $L_i$ are greater than or equal to zero, and typically $L_i \leq L_j$ for i<j, i=2, ... N−1, and $$L_N = L_1 - \sum_{i=2}^{N} L_i.$$

The value of the delay $L_i$ for a particular class of bits thus decreases along the length of the progressive bit stream as the importance of the bits and the desired level of error protection decreases.

A given channel coded bit stream in accordance with the invention may be decoded continuously from a most important bit of the bit stream to a least important bit of the bit stream. Other types of decoding may also be used.

Figure 6:
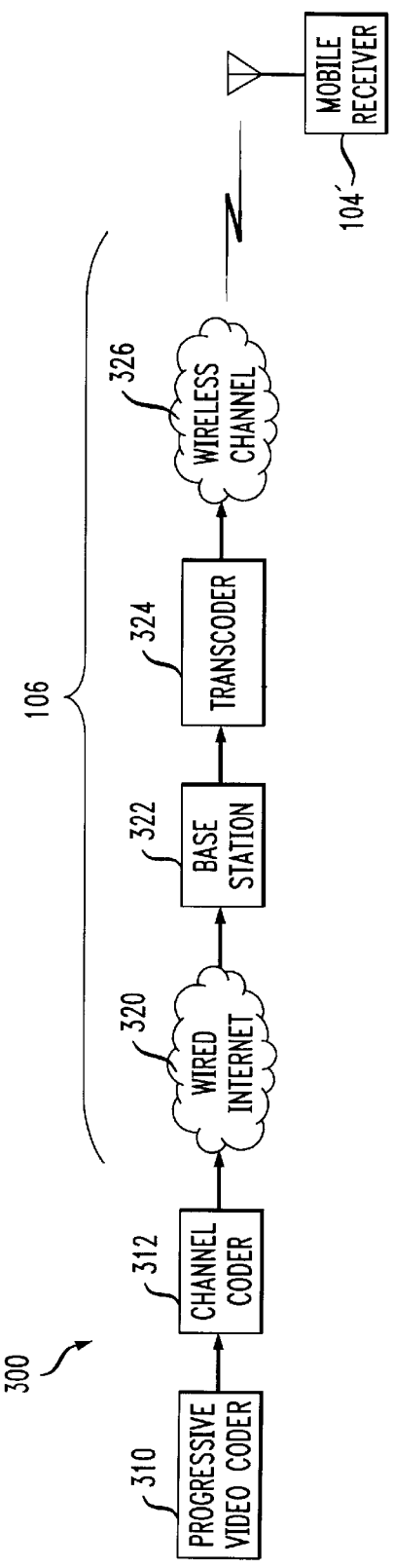
FIG. 6 shows a more specific example of the system of FIG. 1 in which the present invention may be implemented.

FIG. 6 shows a more particular example of a communication system 300 in which the above-described progressive channel error protection can be implemented. The system 300 includes a progressive video coder 310 and a channel coder 312. The transmission medium 106 in this system includes a connection through wired Internet 320 to a base station 322 of a wireless network. A transcoder 324 processes the base station output for delivery via a wireless channel 326 to a mobile receiver 104'. The mobile receiver 104' is assumed to include the channel decoder 114 and source decoder 116 of FIG. 1 as well as additional signal processing elements.

In operation, a progressive video stream is generated by the progressive video coder 310. The channel coder 312 provides progressive channel error protection for the progressive source coded bit stream in the manner previously described in conjunction with FIG. 2. The resulting channel coded output is delivered via transmission medium 106 to the mobile receiver 104' where it is processed to recover the original video stream. Additional details regarding the operation of the system 300 may be found in the above-cited U.S. patent application Ser. No. 09/680,709.

The above-described embodiments of the invention are intended to be illustrative only. For example, although illustrated using convolutional codes applied as channel codes to source coded progressive bit streams, the invention can be implemented using other types of channel codes and other types of information bit streams. In addition, the invention can be used with partitioned bit streams, i.e., bit streams partitioned into two or more classes of bits, so as to provide unequal error protection for the different classes of bits without the need for terminating tail bits in each sub-block of a given frame of bits. Furthermore, the particular system configurations described in conjunction with the illustrative embodiments are shown by way of example only, and numerous alternative system configurations are possible. These and numerous other embodiments within the scope of the following claims will be apparent to those skilled in the art.

What is claimed is:

1. A method for providing channel error protection for a bit stream, the method comprising the steps of:
   channel coding at least a first portion of the bit stream utilizing a channel code having a specified rate associated with a corresponding level of error protection; and
   puncturing the channel code having the specified rate for at least a second portion of the bit stream so as to provide a rate higher than that of the designated rate, wherein commencement of the puncturing step is delayed by an amount determined based at least in part on a memory of the channel code, the delay preventing propagation of errors in a channel decoder used to decode the channel coded bit stream.

2. The method of claim 1 wherein the channel code comprises a convolutional code.

3. The method of claim 1 wherein the bit stream comprises a progressive source coded bit stream.

4. The method of claim 3 wherein the progressive source coded bit stream comprises a progressive source coded video bit stream.

5. The method of claim 3 wherein the progressive source coded bit stream comprises a progressive source coded audio bit stream.

6. The method of claim 1 wherein the bit stream comprises a partitioned source coded bit stream.

7. The method of claim 1 wherein the channel code is terminated only after all bits in a current frame of the bit stream are channel coded.

8. The method of claim 1 wherein the amount of delay is greater than or equal to a memory of the channel code.

9. The method of claim 1 wherein the amount of delay is less than or equal to a decoding depth of the channel decoder.

10. The method of claim 1 wherein the amount of delay comprises a specified number of bits of the bit stream.

11. The method of claim 1 wherein different amounts of delay are provided for puncturing of each of at least a subset of N classes of bits of the bit stream.

12. The method of claim 1 further including the step of decoding the channel coded bit stream continuously from a most important bit of the bit stream to a least important bit of the bit stream.

13. An apparatus for providing channel error protection for a bit stream, the apparatus comprising:

a processor-based device operative to code at least a first portion of the bit stream utilizing a channel code having a specified rate associated with a corresponding level of error protection, the processor-base device being further operative to puncture the channel code having the specified rate for at least a second portion of the bit stream so as to provide a rate higher than that of the designated rate, wherein commencement of the puncturing is delayed by an amount determined based at least in part on a memory of the channel code, the delay preventing propagation of errors in a channel decoder used to decode the channel coded bit stream.

14. The apparatus of claim 13 wherein the channel code comprises a convolutional code.

15. The apparatus of claim 13 wherein the bit stream comprises a progressive source coded bit stream.

16. The apparatus of claim 15 wherein the progressive source coded bit stream comprises a progressive source coded video bit stream.

17. The apparatus of claim 15 wherein the progressive source coded bit stream comprises a progressive source coded audio bit stream.

18. The apparatus of claim 13 wherein the bit stream comprises a partitioned source coded bit stream.

19. The apparatus of claim 13 wherein the channel code is terminated only after all bits in a current frame of the bit stream are channel coded.

20. The apparatus of claim 13 wherein the amount of delay is greater than or equal to a memory of the channel code.

21. The apparatus of claim 13 wherein the amount of delay is less than or equal to a decoding depth of the channel decoder.

22. The apparatus of claim 13 wherein the amount of delay comprises a specified number of bits of the bit stream.

23. The apparatus of claim 13 wherein different amounts of delay are provided for puncturing of each of at least a subset of N classes of bits of the bit stream.

24. The apparatus of claim 13 wherein the channel coded bit stream is decoded continuously from a most important bit of the bit stream to a least important bit of the bit stream.

25. An article of manufacture comprising a storage medium for storing one or more software programs for use in providing channel error protection for a bit stream, wherein the one or more programs when executed implement the steps of:

channel coding at least a first portion of the bit stream utilizing a channel code having a specified rate associated with a corresponding level of error protection; and puncturing the channel code having the specified rate for at least a second portion of the bit stream so as to provide a rate higher than that of the designated rate, wherein commencement of the puncturing step is delayed by an amount determined based at least in part on a memory of the channel code, the delay preventing propagation of errors in a channel decoder used to decode the channel coded bit stream.

* * * * *